United States Patent [19]

Suda et al.

[11] Patent Number: 4,970,780

[45] Date of Patent: Nov. 20, 1990

[54] METHOD FOR THE ASSEMBLAGE OF A SEMICONDUCTOR DEVICE

[75] Inventors: Takumi Suda; Katsuhisa Aizawa; Akio Nakamura, all of Saitama, Japan

[73] Assignee: Shin-Etsu Polymer Co., Ltd., Tokyo, Japan

[21] Appl. No.: 391,412

[22] Filed: Aug. 9, 1989

Related U.S. Application Data

[62] Division of Ser. No. 131,809, Dec. 11, 1987, abandoned.

[30] Foreign Application Priority Data

Dec. 15, 1986 [JP] Japan .................................. 61-299639

[51] Int. Cl.$^5$ ............................................... H05K 3/34
[52] U.S. Cl. ......................................... 29/840; 29/841
[58] Field of Search ................. 29/832, 834, 840, 841, 29/527.2; 357/68, 79, 72, 74, 73, 67

[56] References Cited

U.S. PATENT DOCUMENTS 3,818,279  6/1974  Seeger, Jr. et al. ................... 357/68
4,812,420  3/1989  Matsuda et al. ................... 28/832 X

FOREIGN PATENT DOCUMENTS 52-77684  6/1977  Japan ..................................... 357/79

Primary Examiner—Timothy V. Eley
Attorney, Agent, or Firm—Wyatt, Gerber, Burke and Badie

[57] ABSTRACT

The invention relates to an improvement in the so-called flip-chip method for electrically connecting bonding pads of a semiconductor device, e.g., IC chips, and electrodes of a circuit board. In place of the conventional bumps formed of a solder alloy on the bonding pads, the bonding pads in the invention are formed of a material having electric conductivity and rubbery elasticity so that the reliability of the electric connection can greatly be improved.

1 Claim, 2 Drawing Sheets

PRIOR ART

PRIOR ART

METHOD FOR THE ASSEMBLAGE OF A SEMICONDUCTOR DEVICE

RELATED APPLICATIONS

This application is a division of application Ser. No. 131,809, filed Dec. 11, 1987, now abandoned.

BACKGROUND OF THE INVENTION

The present invention relates to an assembly of a semiconductor device such as IC (integrated circuit) chips or, more particularly, to an assembly of an IC chip and a circuit board electrically connected at the terminals of the IC chip to the electrodes of the circuit board with high reliability despite the simple and inexpensive structure for their connection which enables reduction of the thickness of the assembly.

IC chips are usually used as being electrically connected at their terminals or so-called bonding pads with electrodes of a circuit board which is prepared by patterning the copper foil on a copper-foiled laminated plate such as glass cloth-reinforced epoxy resin laminates, glass cloth-reinforced polyimide resin laminates, polyimide resin films and the like. The most conventional method for electrically connecting the electrodes on the circuit board and the terminals of the IC chip is the so-called wire-bonding method in which a bonding pad of the IC chip and an elecvtrode on the circuit pattern are electrically connected with a very fine wire of gold, aluminum and the like. This method is, however, disadvantageous in respect of the incompatibility with the requirements in the modern semiconductor technology. For example, the increase in the density of integration in the IC chip necessarily results in the number of the bonding pads so that the utilizability of the IC chip can be ensured only by decreasing the size of the individual bonding pads and the pitch of arrangement of the bonding pads. Consequently, an extremely high precision is required in the positioning of the bonding wires and the working time is increased for bonding of an increased number of the bonding wires one by one necessarily leading to an increase in the production costs.

An alternative method for electrically connecting an IC chip and a circuit board, called the flip-chip method, has been developed to solve the above mentioned problems caused by the increase in the density of integration. In this method, each bonding pad on the IC chip is provided with a protrusion or bump formed of a solder alloy and the electrods on the printed circuit board are contacted with these solder bumps to establish electric connection between the respective bonding pads and electrodes. This method is somewhat advantageous over the wire-bonding method in the simplified working process without the individual bonding of the bonding wires but involves several problems. For example, the electric connection cannot be uniform among the sets of the bonding pads and electrodes when the number of the bonding pads is increased depending on the forms of the solder bumps and, in particular, on the planarity of the circuit board. Decrease in the width of the space between adjacent solder bumps requires certain measures to prevent current leakage therebetween due to adsorption of moisture. Moreover, the difference in the thermal expansion is not negligible between a large IC chip and the printed circuit board to cause stress at the contact points of the solder bumps and the electrodes on the circuit board resulting in eventual destruction of the electric connection. Therefore, this method of flip-chip bonding is not always quite satisfactory in respect of the poor reliability of the electric connection.

Further, a method called the TAB method is known and practiced, in which the electric connection between bonding pads of an IC chip and electrodes of a circuit board is obtained by means of a leading wire formed by etching a copper foil adhesively bonded on a continuous-length polyimide film. In this method, a number of leading wires can be exactly positioned together with the IC chip and circuit board and the work time for the electric connection is not unduly long in addition to the advantage that the above mentioned stress caused by the difference in the thermal expansion can be absorbed by the lead wire. This method is, however, disadvantageous because each bonding pad on the IC chip must be provided with a bumped electrode by plating or like method or alternatively the contacting point of the lead wire with the bonding pad must be shaped in the form of a protrusion by etching or like method so that the yield of acceptable products necessarily decreases with consequently increased costs.

SUMMARY OF THE INVENTION

The present invention accordingly relates to an improvement in the above described flip-chip method for electrically connecting a bonding pad of an IC chip and an electrode on a circuit board and has an object to provide an assembly of a semiconductor device such as IC chips and a circuit board electrically connected at the bonding pads or terminals of the former and electrodes of the latter.

Thus, the semiconductor device assembly of the present invention comprises:

(a) a circuit board having a plurality of electrodes; and (b) a semiconductor device having a plurality of terminals each electrically connected to one of the electrodes on the circuit board through;

(c) a bump made of a material having electric conductivity and rubbery elasticity.

BRIEF DESCRIPTION OF THE DRAWING

FIGS. 3 to 5 are each a schematic illustration of an assembly showing a prior art method for electric connection, of which FIG. 3 is for the wire-bonding method, FIG. 4 is for the flip-chip method and FIG. 5 is for the TAB method.

DETAILED DESCRIPTION OF THE PREFERRED EMBODIMENTS

In the first place, the prior art methods for the electric connection between bonding pads of an IC chip and electrodes of a circuit board are briefly reviewed with reference to the accompanying drawing.

Figure 2:
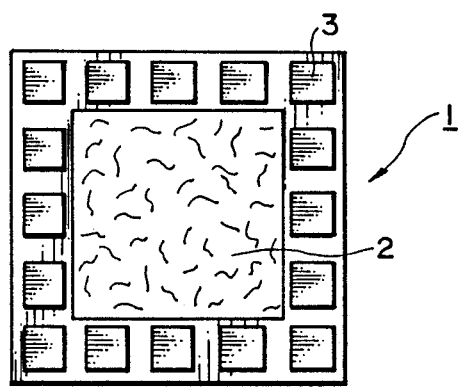
Figure 3:
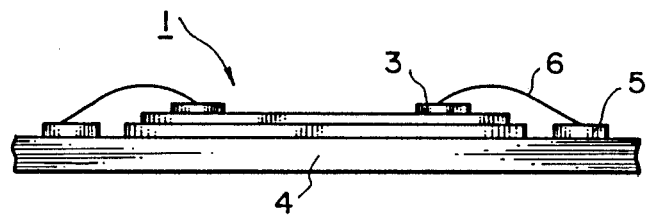

FIG. 2 is a plan view of an IC chip 1 having 16 bonding pads 3 surrounding the active area 2. In FIG. 3 illustrating the wire-bonding method, the IC chip 1 is mounted with the bonding pads 3 facing upward on the circuit board 4 having the electrodes 5 also facing upward. One of the bonding pads 3 and one of the electrodes 5 are electrically connected by means of a fine wire 6 of gold, aluminum and the like which is bonded, for example, by welding at both ends to the bonding pad 3 and the electrode 5.

Figure 4:
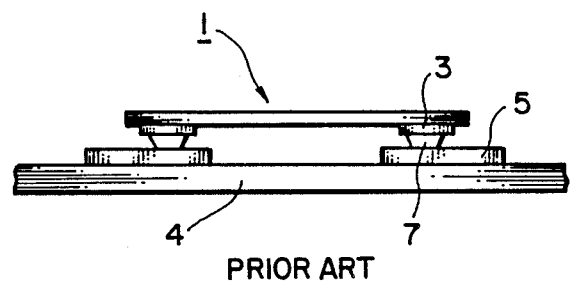
Figure 5:
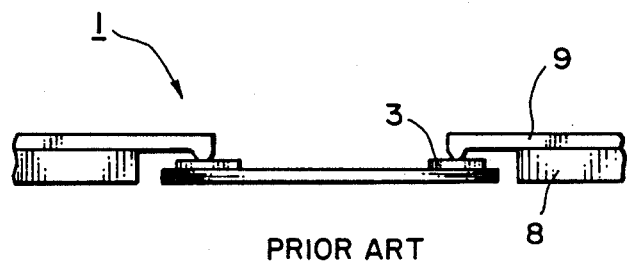

In the flip-chip method illustrated in FIG. 4, each of the bonding pads 3 of the IC chip 1 is provided with a bump 7 of a solder alloy in advance and the bonding pads 3 of the solder alloy 7 are brought into direct contact with the respective electrodes 5 on the circuit board 4 to establish electric connection. In FIG. 5 illustrating the TAB method, the electric connection between a bonding pad 3 of the IC chip 1 and an electrode of a circuit board (not shown in the figure) is obtained through a copper foil-made lead wire 9 adhesively bonded to a polyimide film 8.

Figure 1:
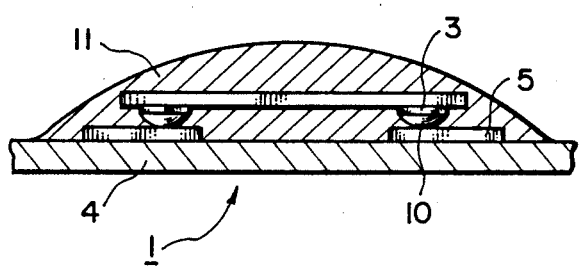
FIG. 1 is a vertical cross sectional view of the inventive assembly and FIG. 2 is a plan view of an IC chip with 16 bonding pads.

In the following, the inventive semiconductor device assembly is illustrated with reference to FIG. 1 showing a vertical cross sectional view of the assembly, in which each of the bonding pads 3 of the IC chip 1 is provided in advance with a bump 10 made from a material having electric conductivity and rubbery elasticity or a rubber bump 10 and the electroconductive rubber bumps 10 are brought into direct contact with the respective electrodes 5 of the circuit board 4 under an appropriate contacting pressure to establish electric connection. The whole assembly is usually encapsulated with a resinous material 11.

The semiconductor device assembly constructed in the above described manner is obtained without a package so that the area occupied by the assembly is not larger than the size of the IC chip to facilitate a compact design of the assembly. In contrast to the prior art chip-on-board methods, in which inspection and screening of IC chips can be performed only after assemblage of the IC chip with a circuit board, the IC chips having bonding pads each provided with an electroconductive and rubbery bump are susceptible to the tests for inspection and screening before assemblage because electric connection can be obtained between the IC chip as such and an outer testing circuit by merely contacting the bonding pads of the IC chip with the electrodes of the circuit under an adequate contacting pressure. Mismatching in the thermal expansion between the IC chip and circuit board presents no difficult problems since the stress caused thereby can readily be absorbed by the rubbery bumps intervening between the contacting points so that the reliability in the electric connection can be greatly increased. Poor planarity of the circuit board also causes little difficulty provided that the rubbery resilience of the bumps is sufficient to compensate therefor. Needless to say, the cost for the assemblage of the inventive assembly is even lower than the cost for the prior art flip-chip method with solder alloy bumps.

The circuit board comprises in the inventive semiconductor device assembly is not particularly limitative in respect of the construction including so-called printed circuit boards prepared by printing, embedding or etching to form a circuit pattern on a substrate board such as copper-foiled epoxy resin laminates, copper-foiled polyimide resin laminates, copper-foiled polyimide resin films and the like as well as those circuit boards used for connection of liquid crystal displays prepared by forming a circuit pattern with an ITO film on a glass plate even when the circuit board is not suitable for electric connection by the conventional chip-on-board methods such as flip-chip method, TAB method and the like.

Although the above mentioned electroconductive rubbery bumps can be formed either on the bonding pads of the IC chip or on the electrodes of the circuit board, they should preferably be formed on the bonding pads of the IC chip in consideration of the problem of exact positioning relative to the bonding pads of the IC chip. The electroconductive rubbery bumps can be formed in various ways easily and reliably with no particular difficulties. For example, the surface of an IC chip having bonding pads is coated with an electroconductive ink or coating composition curable to exhibit rubbery elasticity and the coating layer just on the bonding pads is heated spot-wise with a xenon lamp, halogen lamp and the like or exposed spot-wise to ultraviolet light from a a mercury lamp and the like through openings in a masking plate of nickel, stainless steel and the like having openings in the same pattern as the arrangement of the bonding pads and mounted on the coating layer in such a manner that each opening is just on the bonding pad below the coating layer to effect thermal curing or photocuring of the electroconductive ink followed by dissolving away of the uncured ink from the areas shielded by the masking plate. Alternatively, the electroconductive ink is applied only to the bonding pads through the above mentioned masking plate with openings laid and exactly positioned on the IC chip by screen printing followed by drying or curing of the ink with or without the masking plate.

The above mentioned electroconductive ink is prepared by compounding a polymeric vehicle such as natural rubber, synthetic rubbers, e.g., polychloroprene rubber, polyisoprene rubber and room temperature-curable silicone rubber, thermoplastic elastomers, e.g., polystyene-, polyester-, polyolefin- and polyurethane-based ones, and epoxy-based thermosetting resins of the long-chain aliphatic type having flexibility with from 10 to 60% by volume of a finely divided electroconductive particulate material such as powders of a metal and alloy, e.g., gold, silver, copper, nickel and stainless steel, carbonaceous powders, e.g., carbon black and graphite powder, and glass beads plated with a metal, e.g., gold and nickel, as an agent to impart electroconductivity. It is of course optional according to need that the electroconductive ink is admixed with various known additives including curing agents such as organic peroxides, acid anhydrides, amine compounds and the like depending on the type of the vehicle polymer, primers to improve the affinity between the vehicle polymer and the particles dispersed therein, ultraviolet photosensitizers, photopolymerization initiators, aging retarders, antioxidants and the like.

EXAMPLE

An electroconductive ink composition was prepared by compounding 100 parts by weight of a room temperature-curable silicone rubber as a vehicle with 450 parts by weight of a silver powder having an average particle diameter of 3 $\mu$m after a surface treatment with a silane coupling agent. An IC chip was coated on the surface having bonding pads with the thus prepared electroconductive ink in a thickness of about 10 $\mu$m and the coating layer was overlaid with a nickel-made masking plate having openings in just the same forms and arrangement pattern as the bonding pads beneath the coating layer in such an exact positioning that each opening was just above the respective bonding pad under the coating layer. Thereafter, the coating layer appearing in the openings of the masking plate was heated at 120° C. by using a xenon lamp so that the electroconductive ink in the heated areas was converted into a rubber elastomer. With the masking plate removed, the uncured coating layer in the unheated areas was removed by dissolving away with toluene. The thus obtained IC chip had bonding pads each provided with a rubbery bump having elasticity formed thereon.

The IC chip was press-contacted at the rubber bumps to the electrodes of a circuit board prepared by patterning the copper foil of a copper-foiled, glass cloth-reinforced epoxy resin-laminated board and the whole assembly was encapsulated with an ultraviolet-curable epoxy resin composition to complete a semiconductor device assembly. Despite the greatly decreased working time for the assemblage, the thus obtained semiconductor device assembly had electric properties equivalent to or even better than the conventional assembly by the wire-bonding method. Moreover, the area occupied by the inventive assembly mounted on an electronic instrument was only about one fourth as compared to the conventional assemblies.

What is claimed is:

1. A method for the assemblage of a semiconductor device having a plurality of bonding pads and a circuit board having a plurality of electrodes which comprises:
    (a) coating a surface of the semiconductor device having the bonding pads with an electrically conductive coating composition curable into a rubbery elastomer;
    (b) curing the electrically conductive coating composition selectively on the bonding pads into a rubber elastomer so as to leave uncured electrically conductive coating composition on the areas outside the bonding pads.
    (c) removing the uncured electrically conductive coating composition on the areas outside the bonding pads to leave bonding bumps of the cured composition on the bonding pads; and
    (d) press-contacting the semiconductor device to the circuit board in such a manner that each of the bonding pads of the semiconductor device is electrically connected to one of the electrodes on the circuit board with the bonding bump intervening therebetween.

* * * * *